United States Patent
Pommerenke et al.

(10) Patent No.: US 6,825,411 B2
(45) Date of Patent: Nov. 30, 2004

(54) METHOD AND APPARATUS FOR CONTROLLING ELECTROMAGNETIC RADIATION EMISSIONS FROM ELECTRONIC DEVICE ENCLOSURES

(75) Inventors: David Pommerenke, Rocklin, CA (US); David Dickey, Auburn, CA (US); James J DeBlanc, Roseville, CA (US); Victoria Tsang, Davis, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/430,728

(22) Filed: May 6, 2003

(65) Prior Publication Data

US 2003/0221849 A1 Dec. 4, 2003

Related U.S. Application Data

(63) Continuation of application No. 09/882,851, filed on Jun. 15, 2001, now Pat. No. 6,620,999.

(51) Int. Cl.[7] .............................................. H05K 9/00
(52) U.S. Cl. .............................. 174/35 GC; 174/35 R; 361/800
(58) Field of Search .......................... 174/35 GC, 35 R, 174/35 MS; 361/816, 818, 799, 800

(56) References Cited

U.S. PATENT DOCUMENTS

| | | | | |
|---|---|---|---|---|
| 3,846,608 A | * | 11/1974 | Valles | 174/35 GC |
| 4,523,069 A | * | 6/1985 | Staats | 174/35 GC |
| 4,631,641 A | * | 12/1986 | Brombal et al. | 174/35 R |
| 4,677,251 A | * | 6/1987 | Merewether | 174/35 MS |
| 4,948,922 A | * | 8/1990 | Varadan et al. | 174/35 GC |
| 5,717,577 A | * | 2/1998 | Mendolia et al. | 174/35 GC |
| 6,078,504 A | * | 6/2000 | Miles | 174/35 R |
| 6,274,807 B1 | * | 8/2001 | Pommerenke et al. | 174/35 GC |
| 6,620,999 B2 | * | 9/2003 | Pommerenke et al. | 174/35 GC |
| 6,667,435 B1 | * | 12/2003 | French et al. | 174/35 GC |

* cited by examiner

*Primary Examiner*—Anthony Dinkins
*Assistant Examiner*—Angel R. Estrada

(57) ABSTRACT

A method and apparatus is provided for reducing electromagnetic radiation emissions. The method and apparatus of the present invention also reduce or prevent electromagnetic radiation generated by sources outside of a system assembly from interfering with and adversely affecting electrical circuits in the assembly. An electromagnetic compatibility (EMC) solution uses a lossy element, and/or an element comprised of a combination of lossy and conductive material.

32 Claims, 9 Drawing Sheets

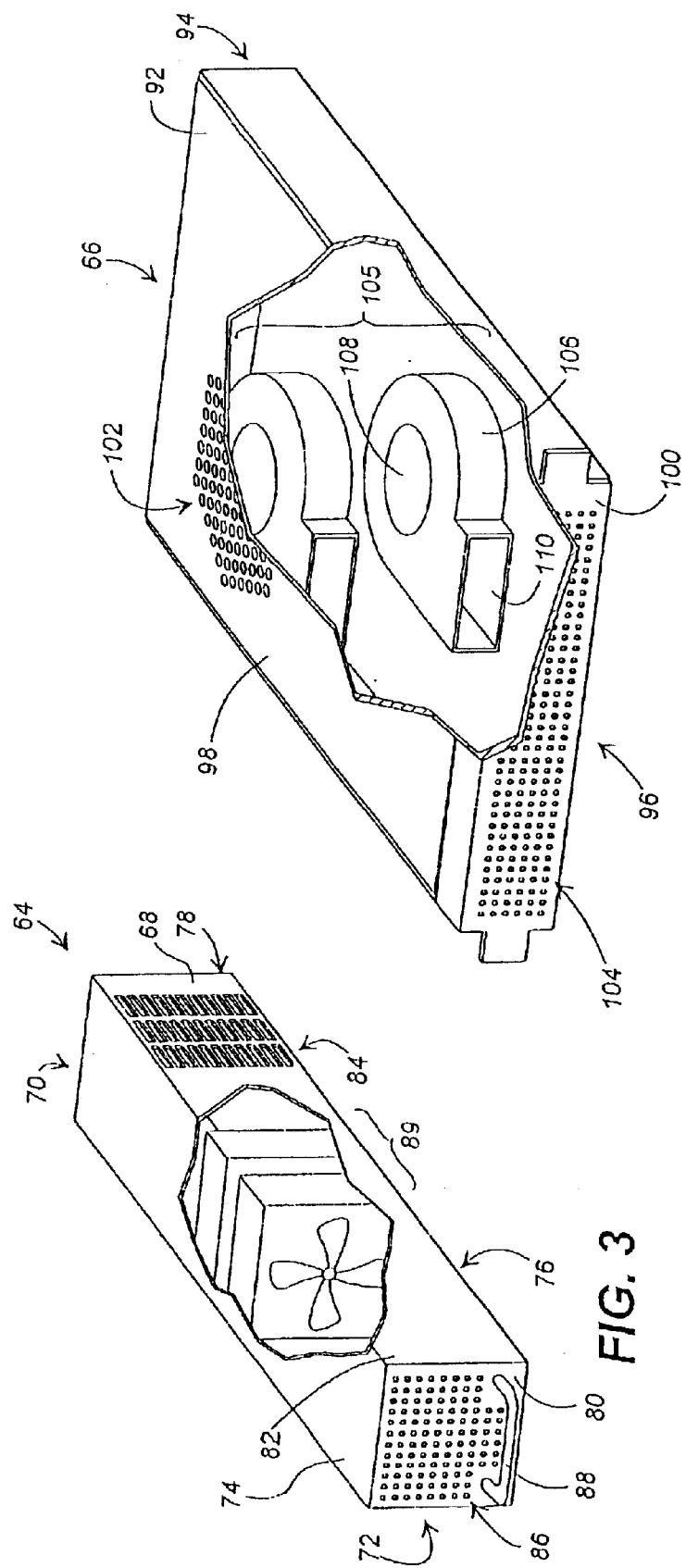

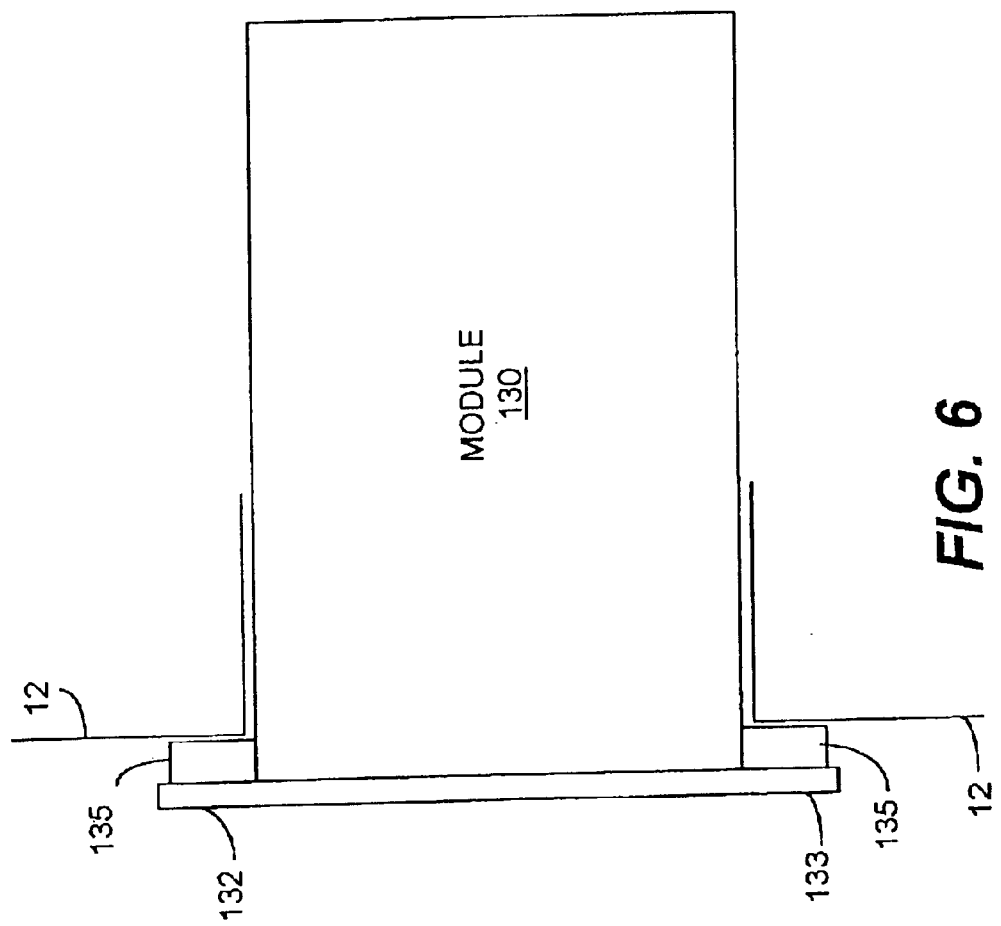

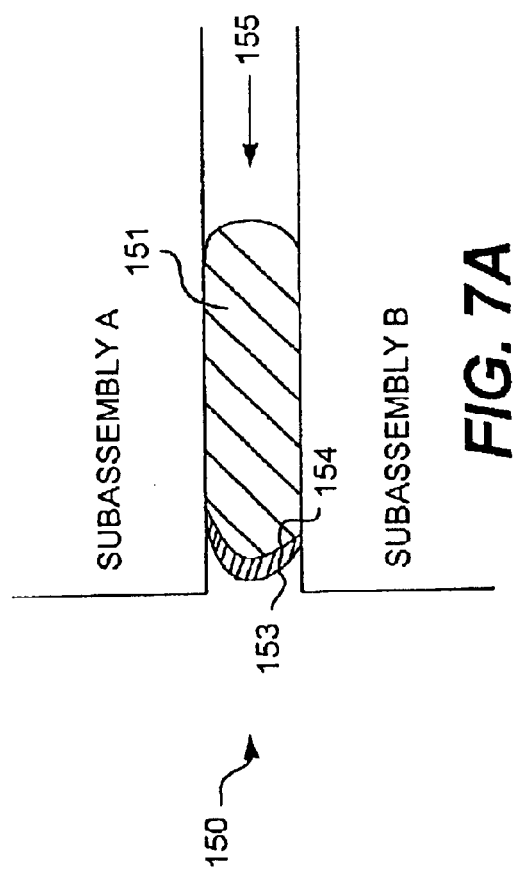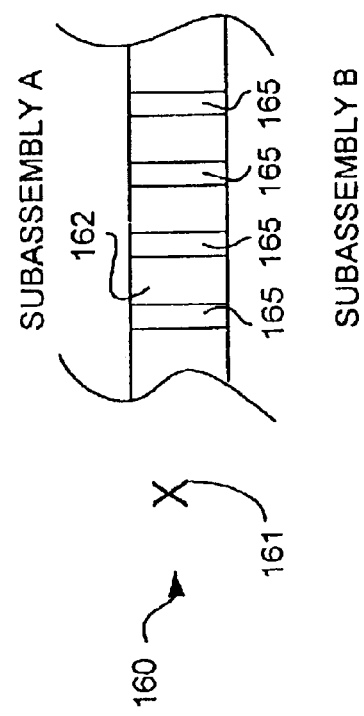

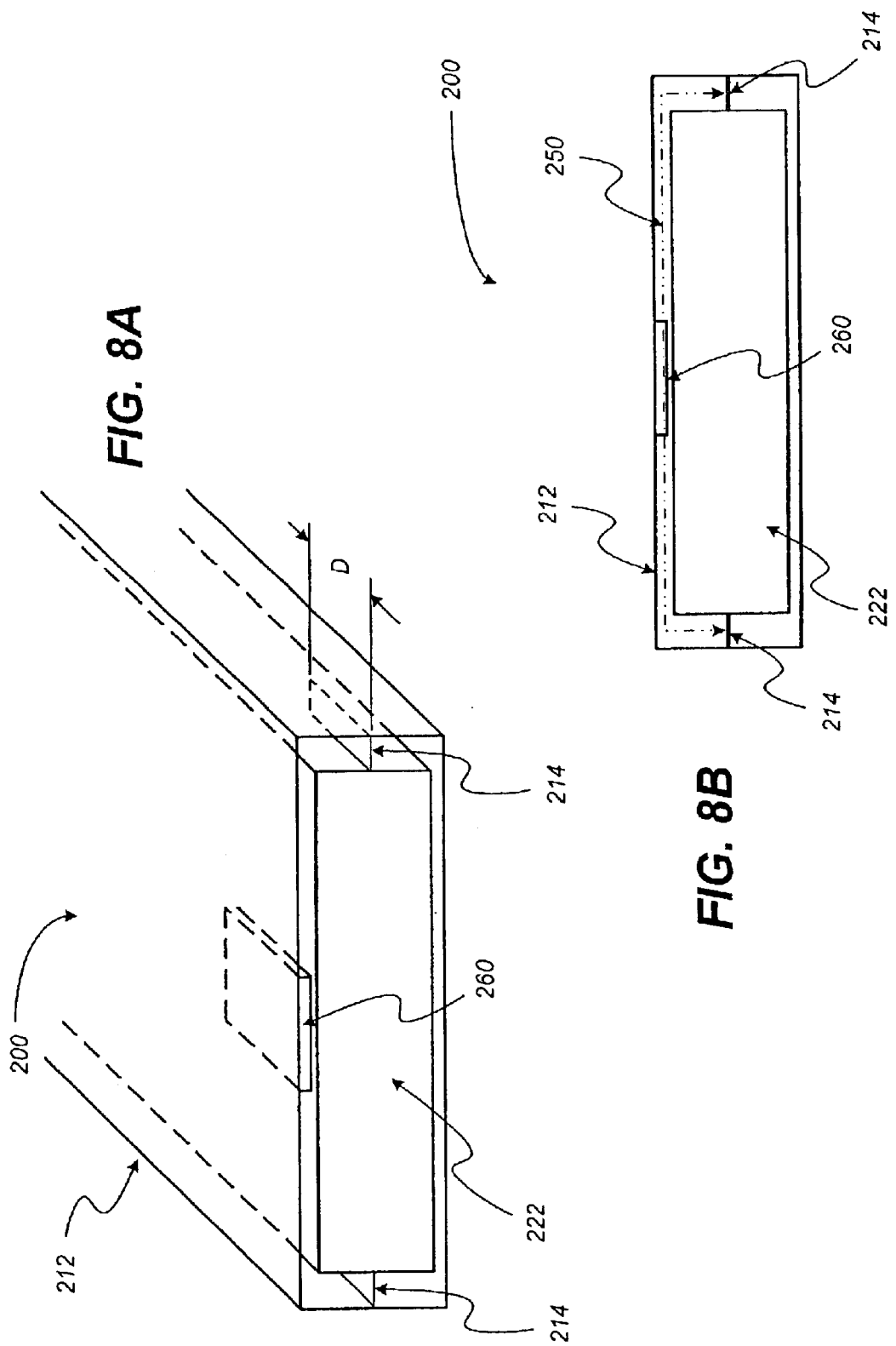

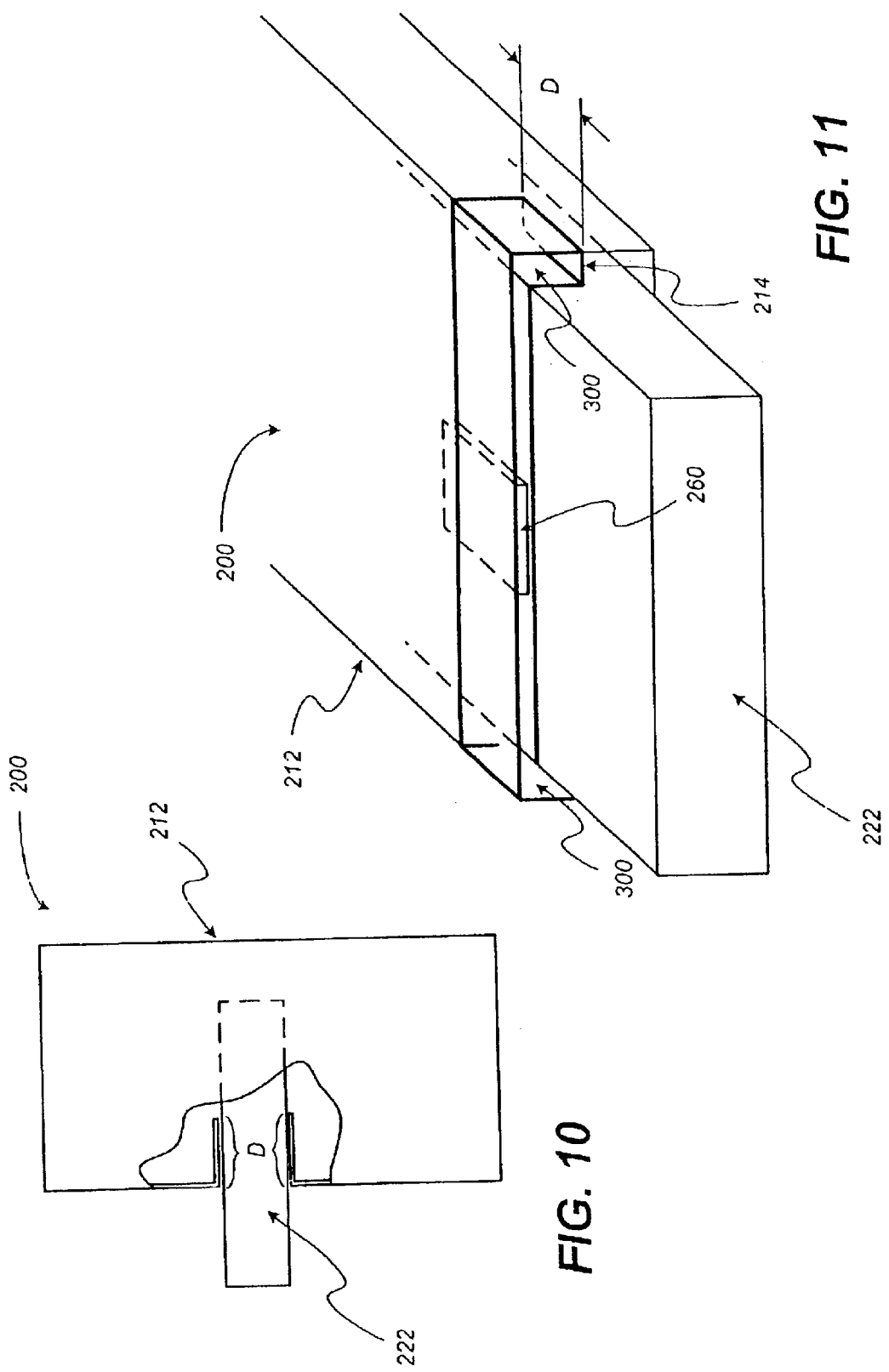

METHOD AND APPARATUS FOR CONTROLLING ELECTROMAGNETIC RADIATION EMISSIONS FROM ELECTRONIC DEVICE ENCLOSURES

CROSS-REFERENCE TO RELATED APPLICATIONS

This application is a continuation of, and claims priority to a commonly assigned U.S. Patent Application entitled, "Method and Apparatus for Controlling Electromagnetic Radiation Emissions From Electronic Enclosures," filed on Jun. 15, 2001 and assigned Ser. No. 09/882,851, now U.S. Pat. No. 6,620,999.

TECHNICAL FIELD

The present disclosure generally relates to a system and method for monitoring a program while the program is executing. More particularly, the system and methods relate to processing breakpoint events in a child process generated by a parent process that has been modified by an instrumentation process.

BACKGROUND

The Active electrical components emit electromagnetic radiation. The Federal Communications Commission (FCC) regulates the amount of electromagnetic radiation that can be emitted from various classes of electrical and electronic devices by promulgating regulations that dictate the maximum amount of electromagnetic radiation that may be emitted from different types of devices. With respect to computer systems and data storage systems, manufacturers typically control electromagnetic radiation by using conductive enclosures and gaskets to prevent emission of electromagnetic radiation from the various assemblies. Conductive gaskets and conductive enclosures reflect radio frequencies impinging on them and thereby prevent the escape of electromagnetic radiation from the assemblies into the surrounding environment.

Conductive gaskets and enclosures generally are effective at controlling emissions as long as contact between conductive parts of the enclosure is continuous and the interfaces between parts of the enclosure are of low impedance. If contact between parts is not continuous, or if the interfaces between conductive parts are of high impedance, the effectiveness of the conductive enclosure or gasket as an electromagnetic shield will be diminished. Consequently, the effectiveness of the electromagnetic shield may be adversely affected by surface conditions on the enclosure and/or by inadequate contact pressure between the various parts of the assembly (i.e., the enclosure, the gasket material, and any inserted modules within the enclosure).

One problem associated with the use of conductive gaskets is that it is difficult to ensure that adequate contact pressure is maintained between the gasket and the enclosure due to manufacturing variations. In addition to manufacturing variations, mechanical vibrations often make it difficult to ensure that the required constant contact pressure is maintained. Moreover, as materials age, wear, or are damaged, they may lose their effectiveness in keeping the gasket and enclosure in close contact. This aging effect is exemplified by springs made from polymers used in an attempt to force the various conductive parts into contact. As the springs age, the gasket and the enclosure may lose adequate contact pressure. These and other problems make it difficult to ensure that adequate contact will be maintained over time. Therefore, it is difficult to ensure the effectiveness of the conductive shielding over time.

Difficulties with ensuring adequate contact between conductive parts of enclosures surrounding electrical circuit components often significantly increase the overall size, weight, and cost of the assembly since additional structures (e.g., flanges, collars, surface treatment, etc.) are added to ensure contact between the enclosures. Furthermore, the desire to maintain adequate contact between the various electromagnetically shielding structures and/or surface treatments generally affects the appearance of the system assembly and/or subassemblies. For example, in some designs, conductive surfaces are left exposed and are not painted. Moreover, the integration of subassemblies provided by different vendors (e.g., power supplies provided by different vendors) is limited by the requirement that the surface conditions of the various subassemblies provide adequate contact when integrated in the final assembly. Consequently, variations in surface characteristics make it difficult to achieve effective shielding in final assemblies consisting of multiple subassemblies.

Another problem associated with conductive shielding is that, with high frequencies, it is extremely difficult to ensure that contact between subassembliesand the assembly enclosure is adequate to control electromagnetic emissions as well as the ingress of eternally generated electromagnetic energy. As frequencies increase, conductive shields become less effective, as the electromagnetic radiation that traverses apertures increases strongly with frequency. Consequently, other shielding methods are used to control high-frequency electromagnetic radiation emissions through various apertures in electrical assemblies.

It is generally known that lossy materials can be used to control electromagnetic radiation. Lossy materials are materials, which absorb, attenuate, and only partially reflect, electromagnetic energy. The ratio of absorption-to-reflectionis determined by various properties of the material and by the electromagnetic properties of the energy impinging on the lossy material. However, it is not known to use lossy materials on the outside of enclosures, or housings, and between subassembly housings and a chassis on which the subassembly housings are mounted, to provide an electromagnetic compatibility solution. With respect to these types of system assemblies, conductive gaskets and materials have been used as an EMC solution for a variety of reasons.

Relatively low frequencies can be effectively shielded using electrically conductive gaskets and enclosures made from electrically conductive materials because conductive contact between parts does not have to be continuous in order to ensure effective shielding of emitters operative at these low frequencies. In other words, gaps can exist between parts forming the various electromagnetic shields while still maintaining effective shielding of electromagnetic emitters from subassembly to subassembly and from the assembly to the surrounding environment. Conductive shielding is also effective at preventing the ingress of externally generated low-frequency radiation.

Conductive shielding has been used not only for electromagnetic compatibility, commonly referred to as EMC, but also to ground various subassembly housings in order to eliminate residual voltages which may exist between different parts of the chassis of the system assembly. Thus, conductive shielding has been viewed as advantageous as it performs both of these functions. A system assembly containing electrical circuits that produce a highest expected frequency of 100 MHz, a distance between contact points of 10 cm is often sufficient to pass FCC class A regulations.

Currently, computer system assemblies and data storage system assemblies implement EMC solutions, which use conductive enclosures and conductive gaskets (i.e., conductive shielding). As computer systems and data storage systems are developed which operate at ever increasing frequencies, it can be expected that the problem of undesired electromagnetic emissions will increase over time. Therefore, there is a need for improved systems and methods that address these and/or other shortcomings of the prior art.

SUMMARY

EMC solutions suitable for shielding electromagnetic emissions between apertures of an assembly enclosure and the external environment are disclosed. EMC solutions well suited for shielding electromagnetic emissions between the various subassemblies within an assembly enclosure are also presented. In this regard, the EMC solutions include introducing a dielectrically-lossy material in apertures of an assembly enclosure and/or in a gap formed by the external surfaces of subassembly modules and the internal surfaces of an assembly enclosure. The lossy element is made from a material that both absorbs and reflects high-frequency electromagnetic emissions.

Embodiments for shielding various internal subassemblies from electromagnetic emitters in other subassemblies, as well as for preventing electromagnetic emissions from traversing an assembly enclosure include a low-impedance contact that electrically couples a module surrounding each subassembly to an assembly enclosure. The modules and the assembly enclosure are at least partially manufactured of metal, conductive plastic, or plastic with a thin metallization layer. The low-impedance contact is arranged such that the contact substantially overlaps these conductive areas of the subassembly modules and the enclosure.

So configured, an assembly controls both low-frequency and high-frequency energy from entering or exiting gaps between subassemblies and/or between subassembly enclosures and a system chassis with two shielding modes.

Other embodiments of the present invention may be interpreted as providing methods for controlling electromagnetic interference. For example, a preferred method includes the steps of: (1) providing a low-impedance contact to electrically couple an assembly enclosure surrounding a module containing electromagnetic emitting devices to an assembly enclosure or chassis; and (2) introducing at least one lossy element in a channel formed by a gap formed by the inner surfaces of the assembly enclosure and the outer surfaces of the module.

Other systems, methods, and features, of the EMC solution will be apparent to one skilled in the art upon examination of the following drawings and detailed description. It is intended that all such additional systems, methods, and features are included within this description, are within the scope of the EMC solution, and protected by the accompanying claims.

BRIEF DESCRIPTION OF THE DRAWINGS

A method and apparatus for controlling electromagnetic radiation emissions are illustrated by way of example and not limited by the implementations in the following drawings. The components in the drawings are not necessarily to scale, emphasis instead is placed upon clearly illustrating the principles involved in controlling electromagnetic radiation. Moreover, in the drawings, like reference numerals designate corresponding parts throughout the several views.

FIG. 3 is a rear perspective view of a power supply module housed in the system assembly of FIGS. 1 and 2.

FIG. 4 is a rear perspective view of an air mover module that may be integrated in the electrical system assembly of FIGS. 1 and 2.

FIG. 6 illustrates one embodiment of the EMC solution of the present invention.

FIGS. 7A and 7B illustrate exemplary forms of the EMC elements of the present invention.

FIG. 8A is a partial perspective view of a module associated with an assembly enclosure that illustrates various elements of the EMC solution.

FIG. 8B is a front view of the assembly of FIG. 8A.

FIG. 10 is a side view of a module associated with an enclosure that illustrates operation of the EMC solution.

FIG. 11 is a partial perspective view of a module associated with an assembly that illustrates operation of the EMC solution for the case where the module extends beyond the enclosure.

DETAILED DESCRIPTION

Figure 1:
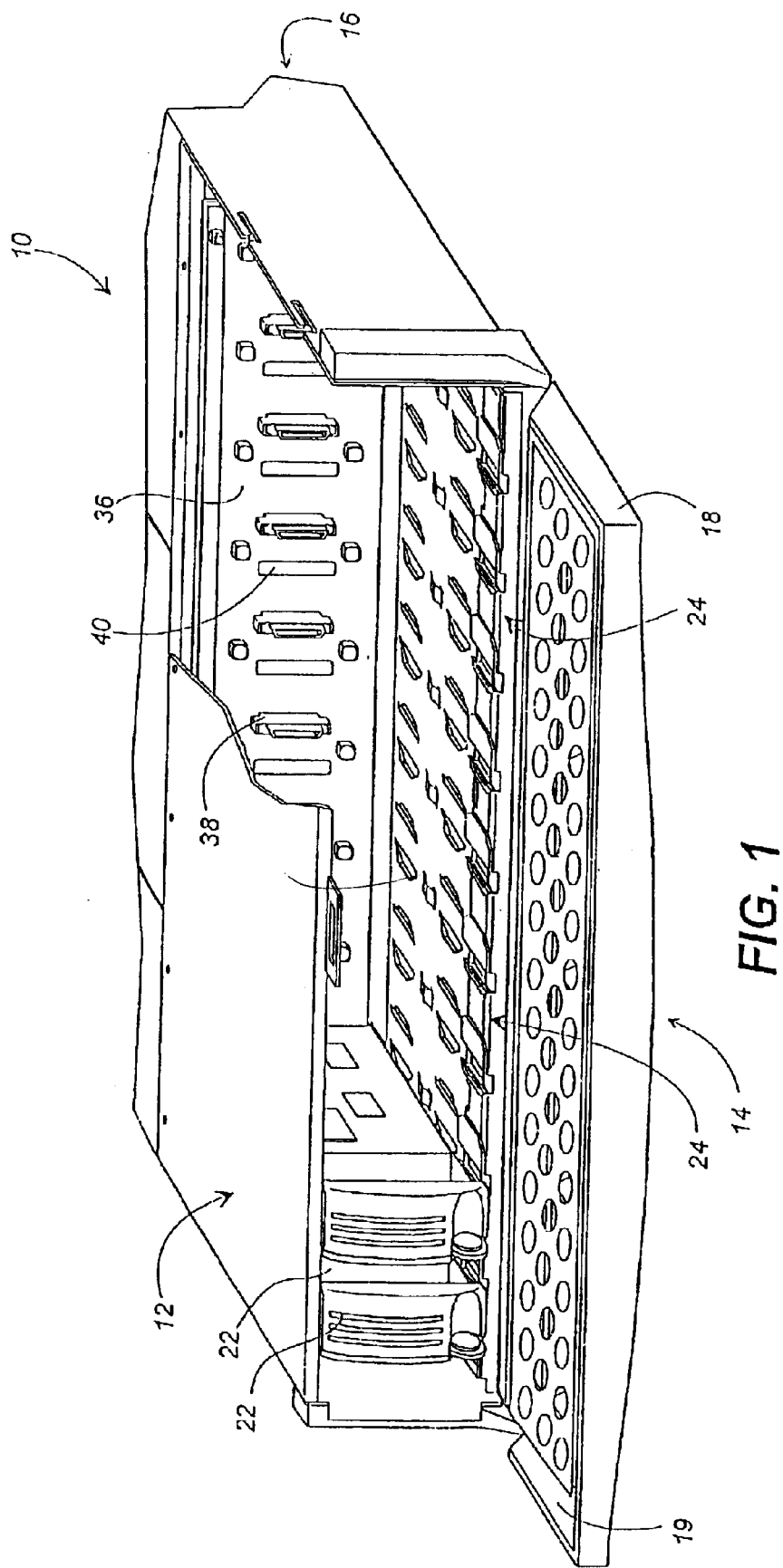
FIG. 1 is a front perspective view of an electrical system assembly designed to hold a plurality of electrical component modules.

In order to meet the need for an EMC solution which is effective for controlling electromagnetic radiation emissions in system assemblies at higher frequencies, an EMC solution is presented that uses lossy materials, or a combination of lossy and conductive materials, within an electrical system assembly. The EMC system is adaptable to a host of electronic assemblies, such as, but not limited to, computer system assemblies or data storage system assemblies.

The EMC solution is not only effective at shielding both low and high frequency emissions, the solution is relatively inexpensive, unobtrusive, and durable. It will be appreciated that the present solution can be adapted to overcome manufacturing variations, mechanical vibration, as well as problems associated with aging, including wear and partial damage to contact surfaces. In addition, the EMC solution overcomes surface conditions and imperfections required for ensuring contact between subassembly enclosures and the overall system enclosure as required by systems that employ the prior art conductive shielding method.

The EMC solution controls the emission of electromagnetic radiation from a system assembly enclosure into the outside environment, as well as the emission of electromagnetic radiation within the system assembly enclosure from subassemblies, or modules, of the system which may interfere with the operation of other subassemblies or modules of the system. In addition, the EMC solution reduces electromagnetic radiation generated outside of the system assembly enclosure from adversely affecting the electrical circuits within the assembly. Such undesired electromagnetic emissions are responsible for electromagnetic interference (EMI) and/or EMC related problems.

EMI is responsible for the low frequency "hum" often detected in poorly shielded sound reproduction equipment. Alternating-currentpower provided by a line cord to the power-supply in unshielded devices is electromagnetically coupled to the signal detection and amplification circuits, resulting in the undesired amplification of the 60 Hz power distribution network frequency. It will be appreciated that EMI may increase the noise floor in a variety of electrical subassemblies over a broad range of frequencies. Moreover, EMI can adversely affect both analog and digital signals. Consequently, EMI affected systems may suffer from degraded performance.

To effectively shield assemblies from electromagnetic emissions from the outside environment, as well as electromagnetic energy from traversing the various subassemblies within an assembly, an EMC solution is provided. The EMC solution uses a combination of at least one low-impedance contact and at least one lossy element.

The lossy element(s) of the EMC solution may be made from materials including, but not limited to, conductive polyethylene, conductive rubber and magnetically-filledsilicon rubber. The low-impedance contact(s) and the lossy element(s) used in the EMC solution may be placed on the outer surfaces of the enclosures of subassemblies and/or on the inner surfaces of the chassis of the system assembly. This arrangement places the low-impedance contact(s) and the lossy element(s) in the electromagnetic energy path between the source of the electromagnetic energy and the outside world.

First, a discussion of the structure of an exemplar electrical system assembly 10 and of the modules housed therein is provided to identify an environment where the EMC solution may be applied to control EMI and to promote EMC between the various subassemblies is provided. After the electrical system assembly is described, a discussion of the manner in which the EMC solution can be used to control electromagnetic radiation emissions to promote EMC between the various subassemblies as well as the system assembly and the external environment is presented.

Figure 2:
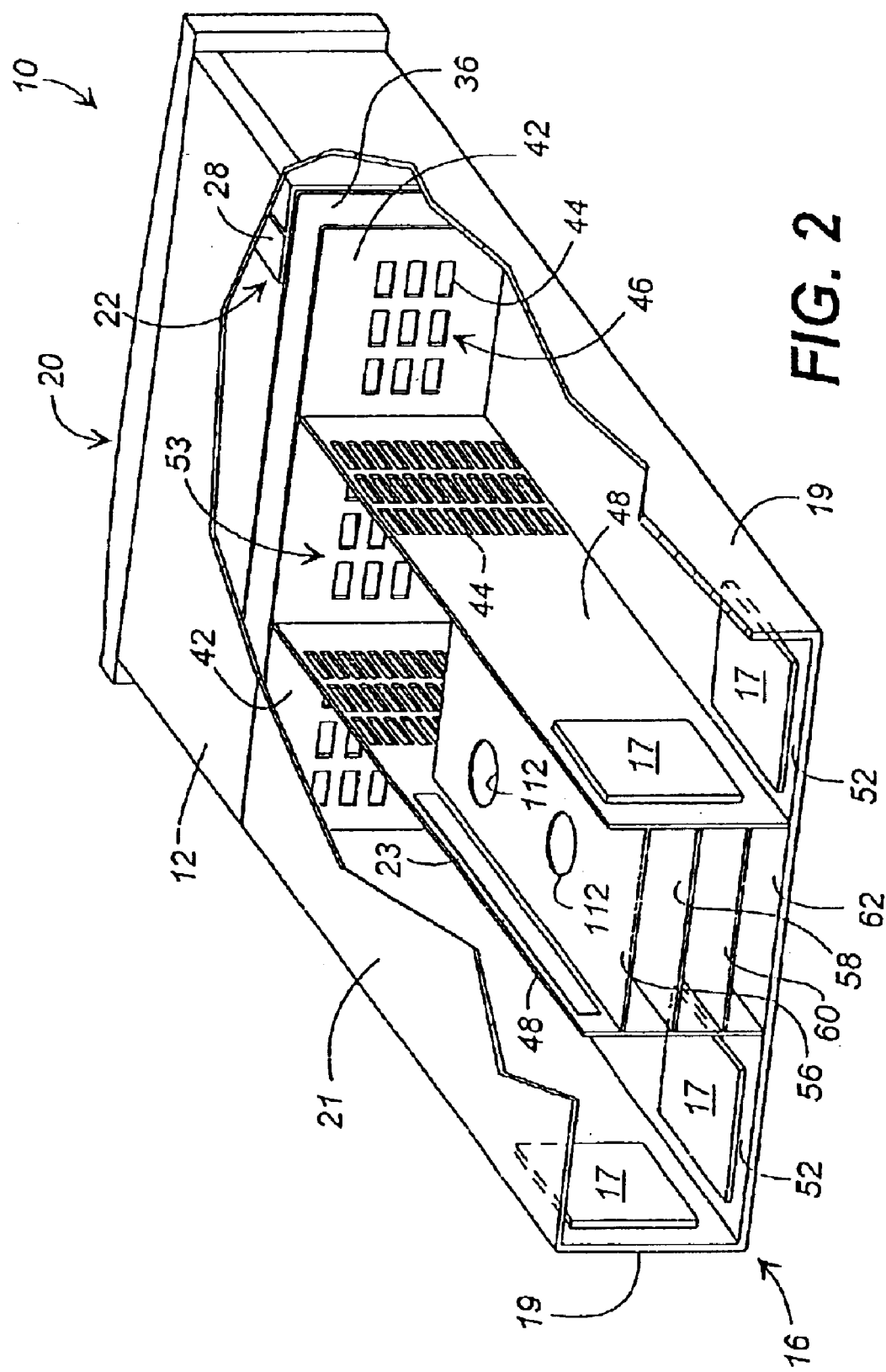
FIG. 2 is a rear perspective view of the electrical system assembly of FIG. 1.

FIGS. 1 and 2 illustrate an electrical system assembly 10 in which the EMC solution can be used in order to control electromagnetic emissions. The electrical system assembly 10 may be, for example, a data storage system assembly. Those skilled in the art will understand that the present invention may be used with any type of electrical system assembly that generates electromagnetic radiation emissions that need to be controlled.

The electrical system assembly 10 comprises a substantially rectilinear enclosure, or chassis 12, having both front and rear ends 14 and 16. Pivotally mounted at the front end 14 of the system assembly enclosure 12 is an enclosure door 18, which provides access to a portion of the enclosure 12 suitable for receiving one or more modules for integration with the electrical system assembly 10. It will be appreciated that in order to conductively shield the outside environment from the contents of the enclosure 12, the enclosure door 18 may be configured with a flange 19 that closely contacts the external surfaces of the enclosure 12 when the enclosure door 18 is in a closed position.

The electrical system assembly 10 is adapted to receive a plurality of modules 22 therein, which may be, for example, data storage modules 22. The modules 22 are received in the enclosure 12 in a plurality of module bays or slots 24. Each data storage module 22 may comprise a data storage device, such as, for example, a disk drive.

Positioned inside of the system assembly enclosure 12 is a main circuit board, generally referred to as a backplane 36. The backplane 36 includes a plurality of electrical connectors 38, such as, for example, multiple-pin connectors, and a plurality of airflow openings 40. The electrical connectors 38 and airflow openings 40 may be arranged on the backplane 36 such that each of the bays 24 of the system assembly enclosure 12 provide the necessary electrical interface (i.e., the electrical connectors 38) and airflow openings 40 for each of the modules 22.

With reference to FIG. 2, the electrical system assembly 10 further includes a transverse wall 42, which spans the width of the system assembly 10. The transverse wall 42 is oriented substantially parallel to the backplane 36. Extending from the transverse wall 42 to the end of the subassembly enclosure 12 are longitudinal walls 48. Together, the longitudinal walls 48, the transverse wall 42, and the walls of the system assembly enclosure 12 define two power supply module housings 52. Extending between the longitudinal walls 48 in substantially parallel planes are a plurality of trays that, together with the longitudinal walls 48 define a first daughter board housing 56, a first air mover pack housing 58, a second air mover pack housing 60, and a second daughter board housing 62.

Figure 5:
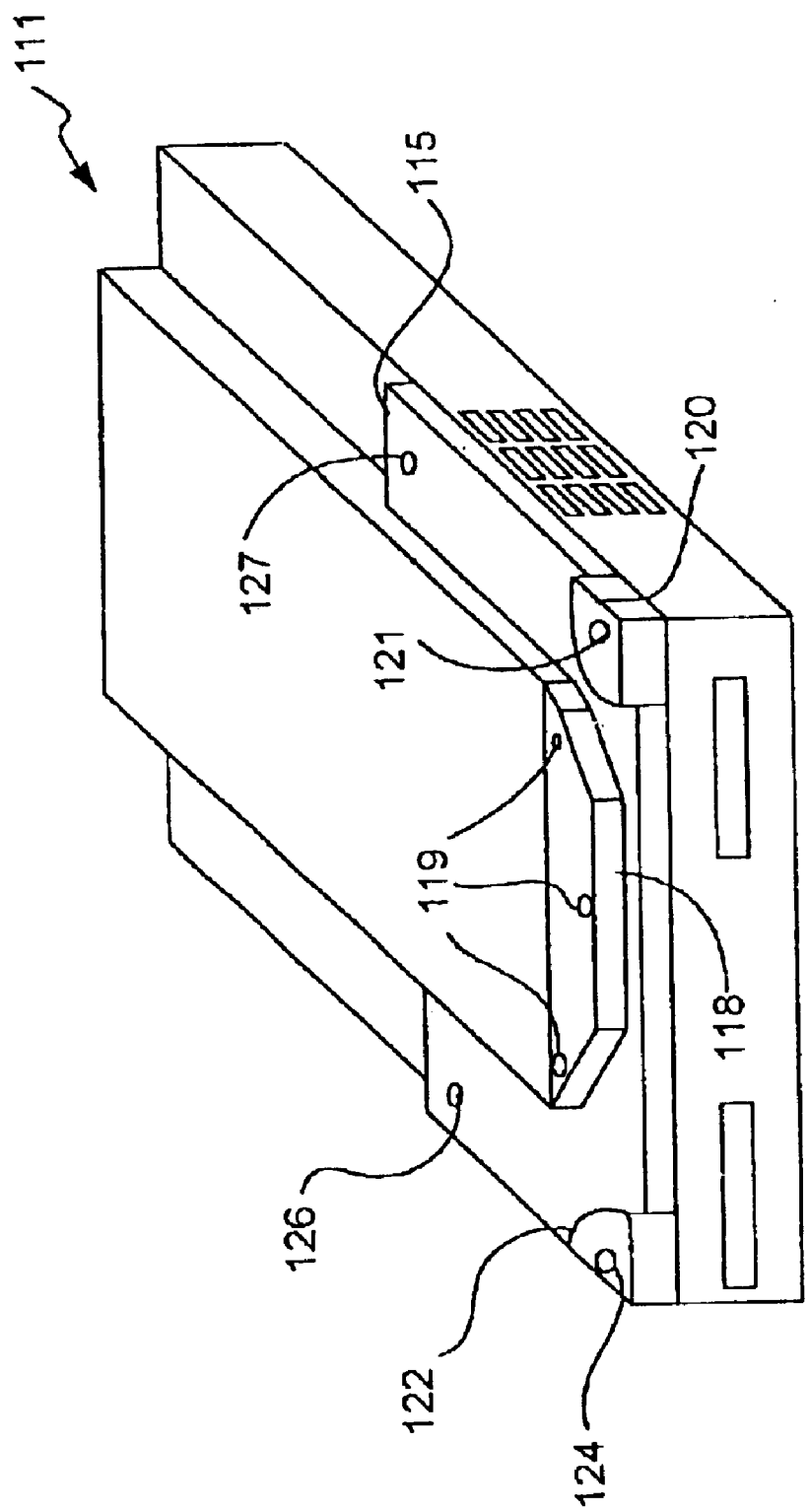
FIG. 5 is a perspective view of a daughter board module that may be integrated in the electrical system assembly of FIGS. 1 and 2.

FIGS. 3, 4, and 5 depict a power supply module 64, a modular air mover pack 66, and a daughter board assembly 111, respectively. The power supply module 64, the modular air mover pack 66, and the daughter board assembly 111 are adapted to be slidably inserted into the power supply module housings 52, the air mover pack housings 58 and 60, and the daughter board housings 56 and 62, respectively. All of these subassemblies generate electromagnetic radiation emissions, which need to be controlled or shielded to prevent EMI induced problems.

As shown in FIG. 3, the power supply module 64 comprises a substantially rectilinear enclosure 68 that includes front and rear ends 70 and 72, respectively. The power supply module 64 also includes a top side 74, a bottom side 76, a front side 78, a rear side 80, and opposed lateral sides 82. Near the front end 70 of the module 64 along the opposed lateral sides 82 are a plurality of perforations 84 which together form an air inlet. Similarly, the rear end 72 of the enclosure 68 is configured with a plurality of perforations 86, which together form an exhaust outlet. Attached to the rear side 80 of the module 64 is a handle 88, which facilitates insertion and removal of the module 64 into the system assembly enclosure 12.

As illustrated in FIG. 4, the air mover pack 66 comprises a substantially rectilinear enclosure 92 that includes front and rear ends 94 and 96, and at least top and rear sides 98 and 100. The top side 98 is provided with at least one perforated area 102 which forms an air inlet. In addition, the rear side 100 of the enclosure 92 is provided with a plurality of perforations 104, which form an exhaust outlet. Mounted inside the pack enclosure 92 is a set 105 of at least one air mover 106. Normally, two such air movers 106 are arranged directly adjacent each other in series, each being formed as a centrifugal fan having an inlet port 108 and an exhaust port 110. The air movers 106 are positioned within the enclosure 92 such that the inlet ports 108 are aligned with one of the perforated areas 102 of the enclosure and the outlet ports 110 face the perforations 104 of the rear side 100 of the enclosure. The air movers 106 draw in air from outside the enclosure 92 through the perforated areas 102 and expel it from the enclosure through the perforations 104.

FIG. 5 is a perspective view of a daughter board module 111, which is integrated within the first daughter board housing 56 shown in FIG. 2. This daughter board module 111 may contain a plurality of circuits that emit energy in the radio frequencies (RF). Consequently, the daughter board module 111 is a source of EMI, which needs to be contained or attenuated. An identical daughter board module 111 may be integrated within the second daughter board housing 62 shown in FIG. 2. The daughter board module 111 may be, for example, an input/output (I/O) card. The manner in which the EMC solution of the present invention is applied to the electrical system assembly 10 and to the subassemblies housed therein will now be described.

However, it is significant to note that the following discussion of potential applications of the EMC solution is only an exemplary demonstration of the manner in which the EMC solution may be implemented. Those skilled in the art will understand that the EMC solution is not limited with respect to the types of lossy and/or conductive materials used, with respect to the dimensions or mechanical characteristics of the enclosures 12 and modules 22, or with respect to the internal electrical subsystems within a system assembly that uses the EMC solution.

With respect to FIG. 1, in accordance with one exemplary implementation of the present invention, the door 18 has the EMC solution applied thereto in the form of a strip of lossy material, or a combination of lossy and conductive material, attached to a flange 19 about the periphery of the enclosure door 18. Preferably, the EMC solution applied in this particular application is a strip comprising a combination of lossy and conductive material. The lossy material occupying the center of the strip and the conductive material occupying the periphery of the strip.

The lossy material, and/or the lossy/conductive material, may be secured to the flange 19 by any suitable attachment mechanism, such as, for example, adhesive (not shown). The enclosure door 18 may be comprised of, for example, a plastic material having a metalized surface (not shown). The enclosure door 18 and the chassis of the system enclosure 12 preferably are designed so that when the enclosure door 18 is placed in the closed position (not shown), the conductive material of the EMC strip contacts the conductive enclosure 12 and the lossy material fills any gaps where continuous contact may not be provided between the conductive material of the EMC strip and the enclosure 12. In this way, any emissions not shielded as a result of the contact between the conductive material of the EMC strip and the enclosure 12 will be absorbed and/or reflected by the lossy material of the EMC strip.

An EMC strip, which is comprised of a lossy material or a combination of lossy and conductive materials, can be designed and implemented in a variety manners. FIGS. 6–7B, discussed below, demonstrate some exemplary embodiments of the manner in which the EMC solution may be applied to shield electromagnetic interferers from both between subassemblies and from the system assembly 10 and the outside environment.

Returning to the assembly 10 of FIG. 2, the transverse wall 42 and the longitudinal walls 48 have air openings 44 formed therein to enable air to be circulated through the assembly 10 by the air mover packs 66. Preferably, sheets (not shown) of lossy material having openings formed therein which match up with the air openings 44 are secured to the transverse walls 42 and 48 to allow air to be circulated within the enclosure 12 while also attenuating electromagnetic radiation impinging on the sheets of lossy material. Lossy material may also be placed in the cavity 53, which normally has a significant amount of empty space. A sheet of lossy material having appropriate air openings and openings for connectors may also be placed between wall 42 and backplane 36. However, as stated above, all of these locations are merely preferred, or candidate, locations for the lossy material or lossy and conductive materials of the EMC solution.

With respect to FIG. 2, the EMC solution preferably is applied at a plurality of locations to reduce EMI between the various subassemblies within the system enclosure 12. For example, a pad 17 of lossy material, or of lossy and conductive materials, may be applied to the side-walls forming the system enclosure 12 and the transverse walls 48 that form the power supply housings 52. A pad 17 of lossy material, or of lossy and conductive materials may also be applied to the inner surfaces of the system enclosure 12 near the rear end 16 of the system assembly.

A strip 23 of lossy material, or a strip of lossy and conductive materials, may be applied to the inner side of the transverse walls 48 forming the daughter board housings 56 and 62. Although only one strip 23 is shown in FIG. 2 affixed to the side of the transverse wall 48 forming the housing 56, an identical strip (not shown) may also be affixed to the surface of the opposing transverse wall 48 further defining the housing 56. Additional strips 23 of lossy material, or strips of lossy and conductive materials, may also be applied to the inner surfaces of the transverse walls 48 defining housings 58, 60, and 62 in an identical manner.

Preferably, the pads 17 are manufactured from a combination of lossy and conductive material, with the conductive material being disposed on a portion of each of the pads 17 that is arranged closest to the rear end 16 of the chassis 12. Similarly, the strips 23 are manufactured from a combination of lossy and conductive materials, with the conductive material being disposed on a portion of the strips 23 closest to the rear end 16 of the chassis 12. By using a combination of conductive and lossy materials for the pads 17 and strips 23 in this manner, electromagnetic radiation propagating toward the rear 16 of the chassis 12 will be partially absorbed by the lossy material of the pads 17 and the strips 23. The remaining energy is reflected toward the front end 14 of the system enclosure 12 where it is absorbed and/or reflected by the lossy material of the previously described sheets.

Reference is now directed to the daughter board module 111 of FIG. 5. The daughter board module 111 has a horseshoe-shaped layer of lossy material 115 secured thereto by fasteners 121, 124, 126, and 127. These fasteners can be any type of fastener such as, for example, screws, rivets, etc. Alternatively, and/or in combination with the fasteners 121, 124, 126, and 127, an adhesive (not shown) may be applied to the lossy material 115 and/or the external surface of the daughter board enclosure to associate the lossy material 115 with the enclosure. A second layer of lossy material 118, which is thicker than the horse-shaped layer 115, is attached to the daughter board 111 by fasteners 119 at the locations shown. Alternatively, the layers 115 and 118 may be made from a combination of lossy and conductive materials.

In the exemplary embodiment of FIG. 5, the locations of the layers 115, 118 was chosen for convenience and because it was determined that the strips would be effective at these locations for absorbing emissions. The lossy material of the EMC solution can be disposed at any suitable location. The lossy material may be disposed at locations where the field strength of the electromagnetic emissions is expected to be the greatest. If information regarding the field strength of emissions is unavailable, the lossy materials may be applied where they can be conveniently located within the subassembly and assembly enclosures. In addition, the lossy material (e.g., the pads 17, the strips 23, the layers 115, and 119, etc.) can vary in thickness and can be applied as a single EMC solution or alternatively applied within an integrated unit or as a plurality of units.

FIG. 6 illustrates another form of the EMC solution which uses a gasket manufactured from a lossy material. As shown in FIG. 6, a module 130 to be mounted to the system enclosure 12 of the assembly 10 has opposing flanges 132 and 133 which are separated from the system enclosure 12 by a lossy gasket 135. Conventional techniques implement a metal, compressible gasket (not shown) in order to provide continuous contact between the metal flanges 132 and 133 and the system enclosure 12. However, as stated above, the conventional technique may be very difficult to implement and its results ineffective for shielding electromagnetic radiation emissions of relatively high frequencies. By using a lossy gasket 135 in the manner shown in FIG. 6 about the periphery of a module 130, electromagnetic radiation emissions can be effectively absorbed and/or reflected to the volume within the system enclosure 12. Consequently, the difficulties associated with implementing a metal gasket are avoided.

It should be noted that it is unnecessary for the lossy material to completely fill the gap between the subassemblies, nor is it necessary for the lossy material to be in physical contact with the subassemblies. This eliminates the need for contact pressure and provides many options with respect to the surface characteristics, such as, for example, aesthetic design, manufacturing tolerances of subassemblies, etc.

FIGS. 7A and 7B illustrate other forms of the EMC solution. FIG. 7A illustrates an EMC solution assembly 150, which illustrates the placement of a composite material (illustrated in a cross-sectional view) between subassembly A and subassembly B. In this regard, the composite material may be introduced in the volume formed by the exterior surfaces of the subassemblies and the interior surfaces of a system enclosure (not shown). The composite material may consist of a lossy material 151 located closer to the interior of the system enclosure with a layer of conductive material 153 located closer to the exterior surfaces (i.e., perpendicular to the longitudinal axis of the space between the subassemblies). Electromagnetic radiation propagating through the gap between subassemblies A and B in the direction indicated by arrow 155 will be absorbed by the lossy material 151 as the electromagnetic radiation traverses the material. Any radiation that is not absorbed (i.e. attenuated by the lossy material 151) will be reflected by the conductive material 153. The reflected radiation is then further absorbed as it traverses the lossy material 151.

FIG. 7B illustrates another EMC solution assembly 160. The EMC solution assembly 160 also uses a combination of lossy material and conductive material. The "X" designated by reference numeral 161 represents the direction of the electromagnetic radiation with respect to the subassemblies A and B (i.e., radiation going into the plane of the figure). The conductive material is indicated by the bands 165, which pass through a cross-section of the EMC solution assembly 160. The lossy material 162 is contained in the gaps formed between adjacent conductive material bands 165. The conductive material bands 165 reflect radiation and the lossy material 162 absorbs impinging electromagnetic radiation. This configuration is suitable in cases where, for example, implementing a conductive gasket would require excessive contact pressure along the external surfaces of the subassemblies A and B.

A variety of materials may be used in the EMC solution. Preferably, a conductive polyethylene is used for the lossy material. Desco Corporation manufactures a dielectrically-lossy polyethylene, known as conductive-polyethylene material P, which is suitable for use as the lossy material in the various embodiments of the EMC solution. Another material which is suitable for this purpose is a dielectrically lossy polyethylene sold by Com-Kyl, Inc., known as Crystal X. Another source of the lossy material is Cumming Microwave Corporation. Cumming Microwave Corporation manufactures several materials, which are suitable as the lossy material. Examples include the dielectrically-lossy C-RAM ALU-25-neoprene and the magnetically-filled silicon rubber material C-RAM GDSS and C-RAM FDSS. However, it should be understood that the present invention is not limited to only these exemplary materials.

Figure 9:
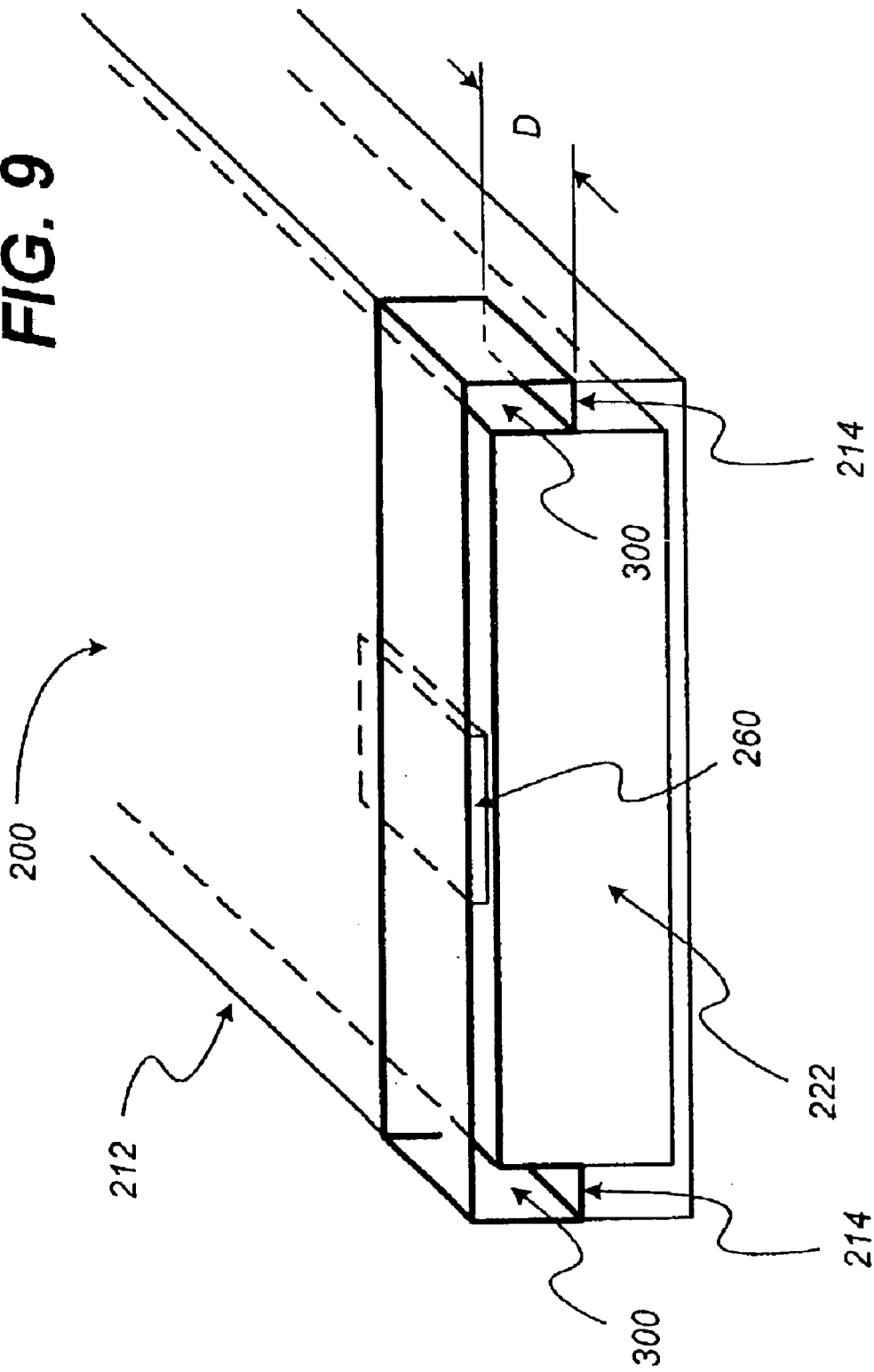
FIG. 9 is a partial perspective view of a module associated with an assembly enclosure that illustrates operation of the EMC solution.

Reference is now directed to FIGS. 8A, 8B, and 9, which further illustrate how the EMC solution may control both low frequency and high frequency electromagnetic emissions. In this regard, FIG. 8A illustrates an assembly 200 that includes an enclosure 212 and a module 222. The enclosure 212 is constructed with a plurality of low-impedance contacts 214 (two shown) having a length, D. The low-impedance contacts 214 form an electrically conductive path between the outer surface of the module 222 and the inner wall of the enclosure 212.

In addition to the low-impedance contacts 214, the assembly 200 also includes a pad 260 of lossy material placed in a gap formed by the inner surface of the top of the enclosure 212 and the upper surface of the module 260. It is important to note that the pad 260 and/or additional pads (not shown) may be placed along the gap formed by the inner side walls of the enclosure 212 and the outer surfaces of the module 222 as well. It is also important to note that alternatively, the pad 260 may be made from a composite containing both lossy and conductive materials.

The enclosure 212 may be manufactured with a material, which has electromagnetic shielding properties. For example, the enclosure 212 may be constructed from a metal. Alternatively, the enclosure may be made from an electrically conductive plastic or of an electrically insulating plastic with a metallization layer. Regardless of the material chosen for the entire enclosure 212, which is preferably one of the materials listed above or other material having similar shielding qualities, the top and bottom and opposing sides for a depth, D, should be constructed of an electrically conductive material that electromagnetically shields the external environment from the electrical circuits contained within the module 222.

When the module 222 is electrically coupled via at least one of the low-impedance contacts 214 to the enclosure 212, low-frequency emissions are prevented from radiating from the assembly 200. A channel formed by the low-impedance contacts 214, the outer surfaces of the upper portion of the module 222, and the adjoining inner surfaces of the enclosure 212 form a waveguide like structure. Below a cut-off or transition frequency, electromagnetic energy which travels along the waveguide is rapidly attenuated by reflection. Consequently, electromagnetic emissions at frequencies lower than the cut-off or transition frequency of the assembly 200 are attenuated quickly. The cut-off or transition frequency may be approximated by a function of the distance between the low-impedance contacts 214 along the centerline 250 (see FIG. 8B) of the channel. If the assembly 200 is configured with a single low-impedance contact 214, the distance of interest is along the centerline of the gap formed by the outer surfaces of the module 222 and the inner surfaces of the enclosure 212 corrected for the width of the low-impedance contact 214.

For example, if the distance, A, along the centerline 250 (FIG. 8B) of the channel is 15 cm, then the cutoff or transition wavelength, λ, is approximately 30 cm, which translates to a cutoff or transition frequency of approximately 1 GHz. The depth, D, of the one or more low-impedance contact(s) 214 to enable the cutoff frequency may be determined from the following relationship.

$$D = \frac{\lambda_{cutoff}}{4} \text{ or } D = 7.5 \text{ cm} \qquad \text{Eq. 1}$$

The channel or waveguide 300 (see FIG. 9) will propagate electromagnetic emissions above the cutoff frequency in one or more propagating modes in the absence of the lossy material pad 260. Because of the combination of the one or more low-impedance contacts 214 and the one or more lossy material pads 260 (one shown), the assembly 200 has two shielding modes.

The operating modes are defined by a low-frequency shielding range and a high-frequency shielding range. The assembly 200 shields low-frequencies through the electrically conductive path provided by the one or more low-impedance contacts 214 when the distance between the one or more low-impedance contacts 214 along the channel 300 is less than one-fourth of the wavelength of the cutoff frequency.

Conversely, the assembly 200 shields high-frequencies by reflecting and attenuating electromagnetic emissions with the pad 260. For the pad 260 to be effective, the frequencies may not be too low as defined above and the depth of the low-impedance contact 214, D, should be greater than one-fourth the wavelength, λ. In this way, a mechanical shielding design, which is generally suited for shielding (i.e., containing) only low-frequency electromagnetic emissions can be extended for use in protecting subassembly electronics from high-frequency EMI. It should be appreciated that the low-frequency shielding range and the high-frequency shielding range overlap. Stated another way, the shielding modes of the EMC solutions are not mutually exclusive within a band of frequencies surrounding the cutoff or transition frequency.

Reference is directed to FIGS. 10 and 11, which illustrate how the EMC solution may control electromagnetic emissions in arrangements where a module extends beyond the confines of an assembly enclosure. In this regard, FIG. 10 illustrates an assembly 200 that includes an enclosure 212 and a module 222. The enclosure 212 is constructed with a plurality of tabs made of an electrically-conductive material. In this particular embodiment, the tabs are arranged to contact the upper and lower external surfaces of the module 222. It will be appreciated that low-impedance contacts 214 (not shown) may be applied along the upper and lower external surfaces of the module 222. As before, the low-impedance contacts 214 form an electrically conductive path between the outer surface of the module 222 and the inner wall of the enclosure 212. Here, the overlap (i.e., the depth from the opening in the enclosure 212) between the enclosure tabs and the external surfaces of the module 222 has a length, D, which relates to the transition frequency for electromagnetic shielding modes for the assembly 200.

As illustrated in the partial perspective view of FIG. 11, a pad 260 of lossy material may be placed in a gap or channel formed by the inner surface of the top of the enclosure 212 and the upper surface of the module 260. The pad 260 and/or additional pads (not shown) may be placed along the gap formed by the inner side walls or bottom surface of the enclosure 212 and the outer surfaces of the module 222 as well. In the embodiment illustrated in FIG. 10, one or more elements of lossy material may be inserted in the aperture formed between the surfaces of the tabs, the top and bottom surfaces of the module 222, and the low-impedance contacts 214 (not shown). Alternatively, the enclosure tabs may be formed to contact (via the low-impedance contacts) the external side surfaces and/or all external surfaces of the module 222.

It is important to note that, not only can the EMC solutions protect the assembly 200 and its internal systems from externally generated electromagnetic emissions, the external environment can be protected from internally generated EMI. For example, a wireless LAN transceiver integrated with a desktop computer may be designed to both transmit and receive electromagnetic signals within a band of defined frequencies. If the host computer system is not properly electromagnetically shielded to attenuate any internally generated emitters in the LAN transmit and receive frequency ranges, LAN performance can be significantly degraded if not totally interrupted. Those familiar with communication link power budgets will appreciate that it may be more desirable to focus shielding efforts over the range of frequencies designated as the LAN signal receive band, as LAN signals received at the host computer's LAN receiver are likely to have a significantly reduced signal to noise ratio than local LAN signal transmissions due to expected signal attenuation.

It is emphasized that the relationship between, A, the length of the centerline 250, D, the depth of the low-impedance contact over the conductive surfaces of the enclosure and the module, and the size, shape, material, and arrangement of the lossy element will depend upon the specific electromagnetic shielding needs of each specific design. For example, in some embodiments the lossy material may be replaced with a composite material that is both lossy and conductive. Such a composite material might be required where the particular application calls for a gasket for protecting an assembly and the external environment from electromagnetic energy having a broad range of frequencies.

The above-described embodiments of the EMC solution, particularly, any "preferred" embodiments, are merely possible examples of implementations, merely set forth for a clear understanding of the principles of the EMC solution. Many variations and modifications can be made to the above-described embodiment(s) of the EMC solution without departing substantially from the spirit and principles thereof. For example, the various enclosures 212 and modules 222 illustrated and described herein have been limited to substantially rectilinear configurations. Various other enclosure and module configurations may use the EMC solution as well. All such modifications and variations are intended to be included herein within the scope of the following claims.

We claim:

1. An assembly, comprising:
   an enclosure having opposing side walls, a top, and a bottom;
   a module configured to integrate with the enclosure, the module having opposing side walls, a top, and a bottom, that surround electrical circuitry, wherein the module is partially surrounded by the enclosure such that a gap is formed between an outer surface of the module and an inner surface of the enclosure along an opening of the enclosure formed by adjacent edges of the opposing side walls, the top, and the bottom of the enclosure;
   a low-impedance contact disposed between an outer surface of the module and an inner surface of the enclosure, wherein the low-impedance contact electrically couples the module to the enclosure; and
   a lossy element disposed in the gap.

2. The assembly of claim 1, wherein a portion of the module and the enclosure that substantially overlap the low-impedance contact are manufactured with materials selected from the group consisting of metal, conductive plastic, or plastic with a thin metallization layer.

3. The assembly of claim 1, wherein the low-impedance contact has a length that is at least one-fourth the wavelength of a transition frequency, wherein electromagnetic energy of frequencies approximately below the transition frequency are substantially prevented from traversing the gap via conventional electrical conduction.

4. The assembly of claim 1, wherein the lossy element is fixed to an outer surface of the module.

5. The assembly of claim 1, wherein the lossy element is fixed to an inner surface of the enclosure.

6. The assembly of claim 1, wherein the lossy element has a depth that approximates the length of the low-impedance contact.

7. The assembly of claim 1, wherein the lossy element comprises a material that both absorbs and reflects high-frequency electromagnetic energy.

8. The assembly of claim 1, wherein the lossy element comprises a sheet manufactured from a dielectrically-lossy polyethylene.

9. The assembly of claim 1, wherein the lossy element comprises a pad manufactured from a dielectrically-lossy polyethylene.

10. The assembly of claim 1, wherein the enclosure further comprises a transverse internal wall configured with at least one opening.

11. The assembly of claim 1, wherein the lossy material comprises a dielectrically-lossy polyethylene.

12. The assembly of claim 2, wherein the low-impedance contact has a length that is at least one-fourth the wavelength of a transition frequency, wherein electromagnetic energy of frequencies approximately above the transition frequency are substantially prevented from traversing the gap by being reflected and attenuated by the lossy material.

13. The assembly of claim 7, wherein the lossy element comprises a material that is electrically conductive.

14. The assembly of claim 10, wherein the transverse internal wall comprises a layer of lossy material on the surface adjacent to the module.

15. The assembly of claim 11, wherein the lossy material comprises a material selected from the group consisting of conductive polyethylene, conductive rubber and magnetically-filled silicon rubber.

16. The assembly of claim 13, wherein the lossy element comprises a gasket.

17. An assembly, comprising:
   means for preventing electromagnetic energy of a frequency approximately below a transition frequency from traversing a gap formed by the outer surface of a module and the inner surface of an enclosure, wherein the module surrounds electrical circuitry generating the electromagnetic energy; and
   means for preventing electromagnetic energy of a frequency approximately above a transition frequency from traversing the gap.

18. The assembly of claim 17, wherein the means for preventing electromagnetic energy of a frequency approximately below the transition frequency from traversing the gap comprises an electrically conductive path from the module to the enclosure.

19. The assembly of claim 18, wherein the means for preventing electromagnetic energy of a frequency approximately above the transition frequency from traversing the gap comprises disposing at least one lossy element in the gap.

20. The assembly of claim 18, wherein the electrically conductive path from the module to the enclosure comprises a low-impedance contact that substantially overlaps an electrically conductive portion of both the module and the enclosure.

21. The assembly of claim 19, wherein the lossy element comprises a material selected from the group consisting of conductive polyethylene, conductive rubber and magnetically-filled silicon rubber.

22. The assembly of claim 20, wherein the low-impedance contact has a length that is at least one-fourth the wavelength of the transition frequency.

23. A method for controlling electromagnetic interference, comprising the steps of:
   providing a low-impedance contact to electrically couple an electrically conductive assembly enclosure to an electrically conductive module, the enclosure partially surrounding the module, wherein the module surrounds electromagnetic emitting circuits; and
   introducing at least one lossy element in a channel formed by the inner surfaces of the assembly enclosure, the outer surfaces of the module, and the low-impedance contact.

24. The method of claim 23, wherein the low-impedance contact has a length that is at least one-fourth the wavelength of a transition frequency, wherein electromagnetic energy of frequencies approximately below the transition frequency are substantially prevented from traversing the channel via conventional electrical conduction.

25. The method of claim 23, wherein the low-impedance contact has a length that is at least one-fourth the wavelength of a transition frequency, wherein electromagnetic energy of frequencies approximately above the transition frequency are prevented from traversing the channel by being reflected and attenuated by the lossy material.

26. An assembly, comprising:
   an enclosure having opposing side walls, a top, and a bottom that surround electrical circuitry, wherein the enclosure comprises an opening formed by adjacent edges of at least one of the opposing side walls, the top, and the bottom of the enclosure; and
   a composite material that is dielectrically-lossy and electrically conductive disposed in the opening.

27. The assembly of claim 26, wherein a portion of the enclosure overlaps at least a portion of the composite material.

28. The assembly of claim 26, wherein the composite material both absorbs and reflects electromagnetic energy.

29. The assembly of claim 28, wherein the composite material is selected from the group consisting of conductive polyethylene, conductive rubber and magnetically-filled silicon rubber.

30. The assembly of claim 28, wherein the composite material comprises a gasket.

31. The assembly of claim 26, wherein the composite material is manufactured with materials selected from the group consisting of metal, conductive plastic, or plastic with a thin metallization layer.

32. The assembly of claim 28, wherein electromagnetic energy having frequencies above a transition frequency are substantially prevented from traversing the opening.

* * * * *